(12) United States Patent
Tsai et al.

(10) Patent No.: US 9,368,629 B2
(45) Date of Patent: *Jun. 14, 2016

(54) DIODE STRUCTURE COMPATIBLE WITH FINFET PROCESS

(71) Applicant: Taiwan Semiconductor Manufacturing Company, Ltd., Hsin-Chu (TW)

(72) Inventors: Tsung-Che Tsai, Hsin-Chu (TW); Yi-Feng Chang, Xinbei (TW); Jam-Wem Lee, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/752,480

(22) Filed: Jun. 26, 2015

(65) Prior Publication Data

US 2015/0295088 A1   Oct. 15, 2015

Related U.S. Application Data

(63) Continuation of application No. 13/689,327, filed on Nov. 29, 2012, now Pat. No. 9,093,492.

(51) Int. Cl.
| | |
|---|---|
| *H01L 29/76* | (2006.01) |
| *H01L 29/78* | (2006.01) |
| *H01L 29/739* | (2006.01) |
| *H01L 29/66* | (2006.01) |

(52) U.S. Cl.
CPC ...... *H01L 29/7851* (2013.01); *H01L 29/66795* (2013.01); *H01L 29/7391* (2013.01); *H01L 29/785* (2013.01)

(58) Field of Classification Search
CPC .................. H01L 29/7391; H01L 29/785
USPC ........... 257/288, 327, E21.411; 438/136, 137
See application file for complete search history.

(56) References Cited

U.S. PATENT DOCUMENTS

| | | | |
|---|---|---|---|
| 2006/0273372 A1* | 12/2006 | Voldman et al. | ............... 257/308 |
| 2008/0067587 A1* | 3/2008 | Gossner et al. | ............... 257/336 |
| 2009/0184369 A1 | 7/2009 | Zhu | |

FOREIGN PATENT DOCUMENTS

| | | |
|---|---|---|
| CN | 1695245 A | 11/2005 |
| KR | 1020050089805 | 9/2005 |
| WO | 2004051749 A1 | 6/2004 |

* cited by examiner

*Primary Examiner* — Matthew Gordon
(74) *Attorney, Agent, or Firm* — Slater Matsil, LLP

(57) ABSTRACT

An embodiment integrated circuit (e.g., diode) and method of making the same. The embodiment integrated circuit includes a well having a first doping type formed over a substrate having the first doping type, the well including a fin, a source formed over the well on a first side of the fin, the source having a second doping type, a drain formed over the well on a second side of the fin, the drain having the first doping type, and a gate oxide formed over the fin, the gate oxide laterally spaced apart from the source by a back off region of the fin. The integrated circuit is compatible with a FinFET fabrication process.

20 Claims, 6 Drawing Sheets

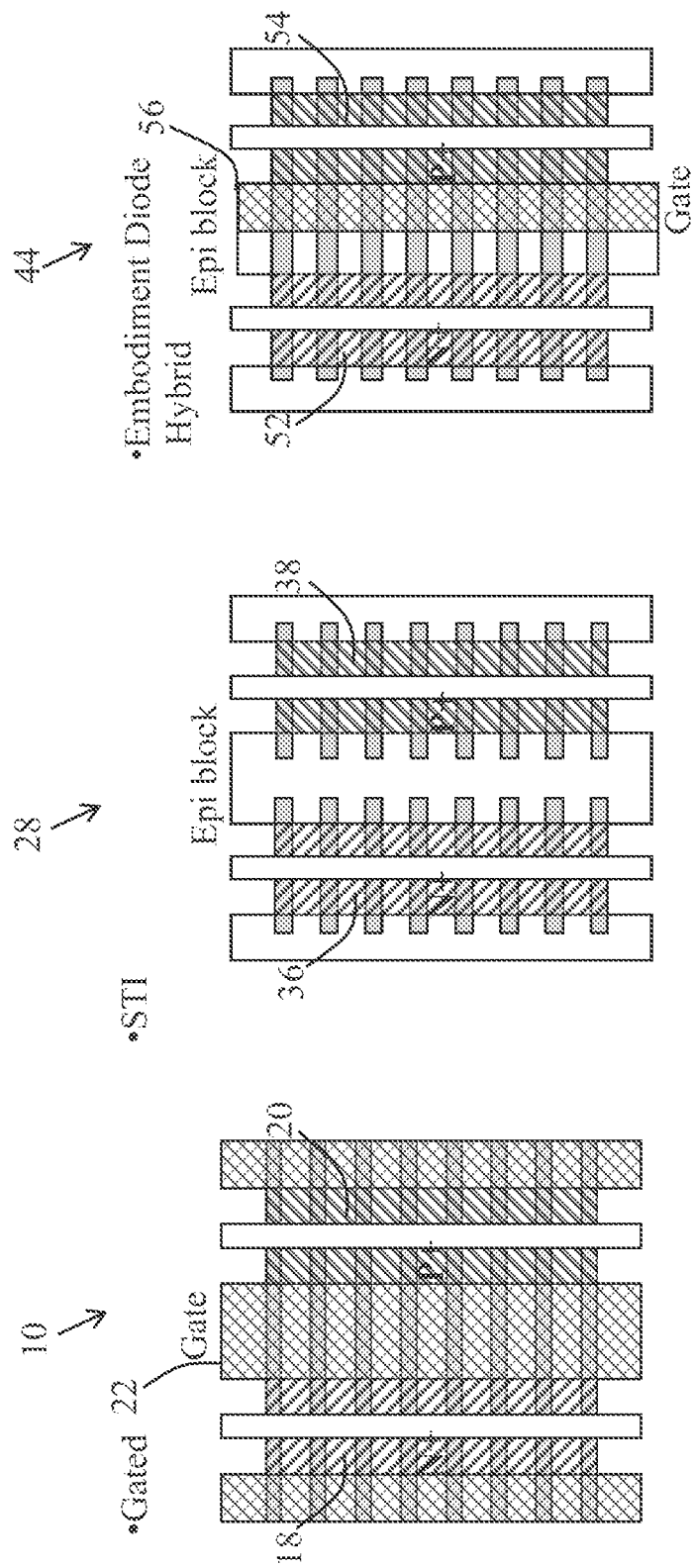

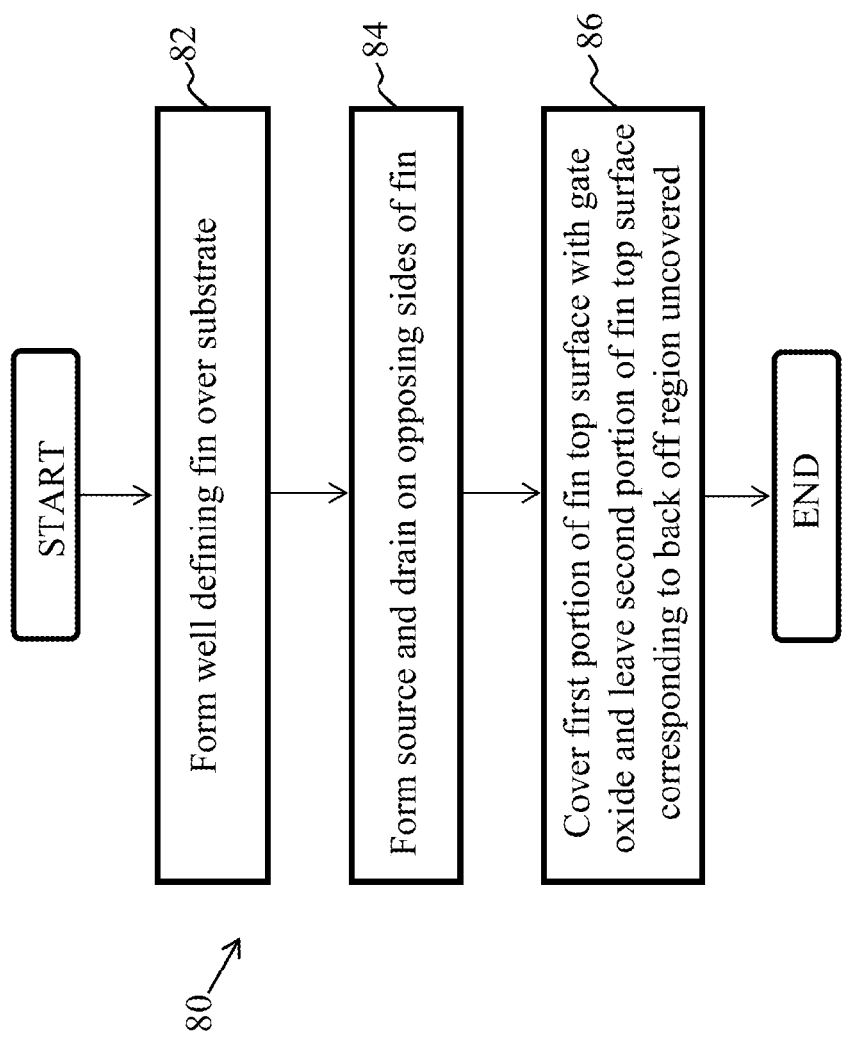

DIODE STRUCTURE COMPATIBLE WITH FINFET PROCESS

This application is a continuation application of U.S. application Ser. No. 13/689,327, entitled "Diode Structure Compatible With FinFET Process," filed on Nov. 29, 2012, which application is hereby incorporated herein by reference in its entirety.

BACKGROUND

A diode is an electrical device allowing current to move through it in one direction with far greater ease than in the other. The most common kind of diode in modern circuit design is the semiconductor diode.

Examples of the semiconductor diode include a shallow trench isolation (STI) diode and a gated diode. Both of these types of diodes generally have fast turn-on times and high conductance, which makes them well-suited for electro-static discharge (ESD) protection circuits.

In some cases, the gated diode may be formed using a fin field-effect transistors (FinFET) process. FinFETs have allowed the semiconductor industry to continue shrinking the size and increasing the speed of individual FETs. Indeed, FinFETs or multiple gate transistors may be used in sub 32 nm transistor nodes. FinFETs not only improve areal density but also improve gate control of the channel.

Unfortunately, both gated diodes and STI diodes may suffer from undesirable drawbacks.

BRIEF DESCRIPTION OF THE DRAWINGS

For a more complete understanding of the present disclosure, and the advantages thereof, reference is now made to the following descriptions taken in conjunction with the accompanying drawing, in which:

FIG. 4 is a top plan view of the conventional gated diode of FIG. 1;

FIG. 5 is a top plan view of the conventional STI diode of FIG. 2;

FIG. 6 is a top plan view of the embodiment diode of FIG. 3;

FIG. 10 is a method of forming the embodiment diode of FIG. 3.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

The present disclosure will be described with respect to preferred embodiments in a specific context, namely a diode structure compatible with a FinFET process. The disclosure may also be applied, however, to other integrated circuits, electronic structures, and the like.

Figures 1, 2:
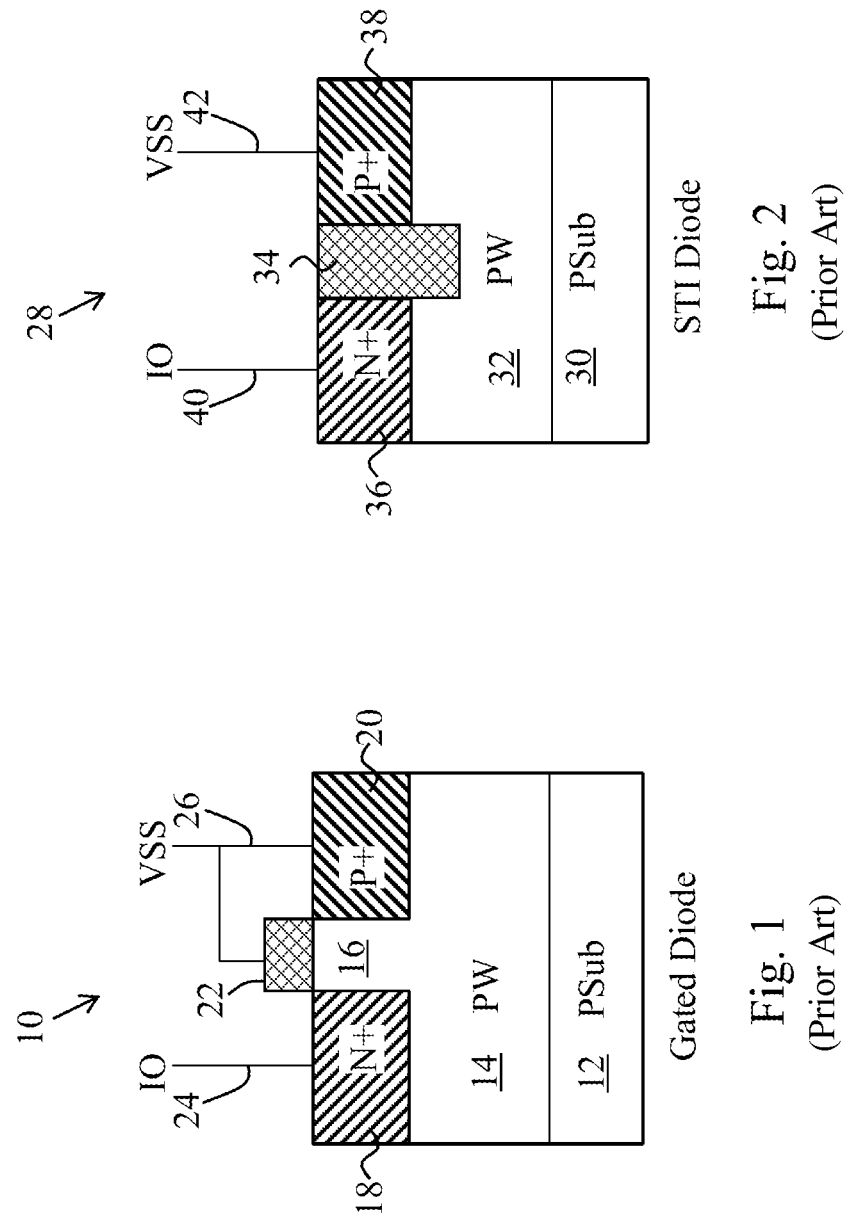
FIG. 1 is a conventional gated diode.
FIG. 2 is a conventional shallow trench isolation (STI) diode.

Referring now to FIG. 1, a conventional gated diode 10, which is formed using the FinFET process, is illustrated for reference. As shown, the conventional gated diode 10 includes a substrate 12 (e.g., a p-type substrate) supporting a well 14 (e.g., a p-well). A fin 16 (or portion of the well 14) is disposed between a source 18 (e.g., a heavily-doped n-type source) and a drain 20 (e.g., a heavily-doped p-type drain). As shown, a gate oxide 22 (i.e., a gate) is disposed over the fin 16. In addition, an input/output (IO) 24 is electrically coupled to the source 18 and a ground 26 (Vss) is electrically coupled to the gate 22 and the drain 20.

Unfortunately, the gated diode 10 of FIG. 1 suffers from overstress issues when used in an overdrive application. For example, when the IO 24 is supplied with more than about three volts (e.g., 3.3V), the gate oxide 22 is overstressed and may not survive. As such, the gated diode 10 may experience a degraded performance or a complete failure.

Referring now to FIG. 2, a conventional shallow trench isolation (STI) diode 28 is also illustrated for reference. As shown, the conventional STI diode 28 includes a substrate 30 (e.g., a p-type substrate) supporting a well 32 (e.g., a p-well). A pocket of shallow trench isolation (STI) 34 is formed between a source 36 (e.g., a heavily-doped n-type source) and a drain 38 (e.g., a heavily-doped p-type drain). An input/output (TO) 40 is electrically coupled to the source 36 and a ground 42 (Vss) is electrically coupled to the drain 38.

While the STI diode 28 of FIG. 2 avoids the overstress condition detrimentally affecting the gated diode 10 of FIG. 1, the STI diode 28 has a relatively large on resistance ($R_{on}$) compared to the gated diode 10. Because of the large on resistance, the STI diode 28 may experience a degraded performance. In addition, the STI diode 28 is subject to the area penalty.

Figure 3:
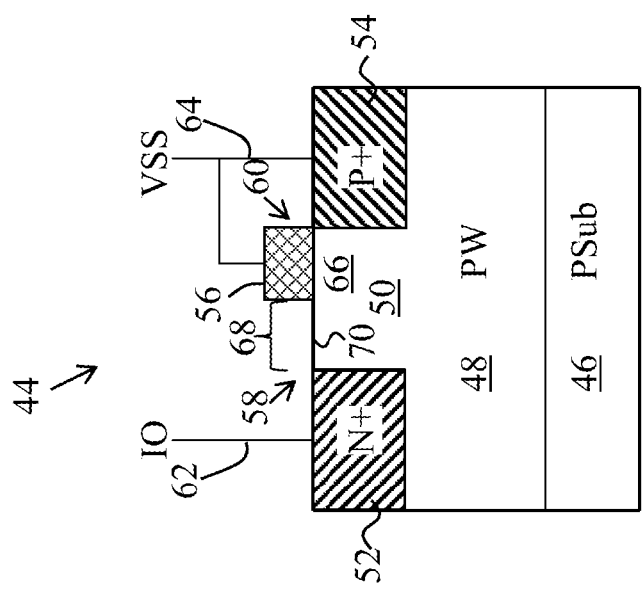
FIG. 3 is an embodiment diode having a back off region and compatible with a fin field-effect transistor (FinFET) fabrication process.

Referring now to FIG. 3, an embodiment diode 44 compatible with a FinFET formation process is illustrated. As shown, the embodiment diode 44 includes a substrate 46, a well 48 defining a fin 50, a source 52, a drain 54, and a gate oxide 56 (i.e., gate). In an embodiment, the substrate 46 is formed from silicon or a silicon-containing material. In an embodiment, the substrate 46 and the well 48 are each doped as p-type. In an embodiment, the well 48 may be more heavily doped than the substrate 46.

As shown, the source 52 is generally formed over the well 48 and disposed on a first side 58 of the fin 50 while the drain 54 is generally formed over the well 48 and disposed on a second side 60 of the fin 50. In other words, the source 52 and the drain 54 are disposed on opposing sides of the fin 50. In an embodiment, the source 52 is doped as an n-type. In an embodiment, the drain 54 is doped as a p-type. In an embodiment, the drain 54 is more heavily doped than the well 48 and/or the substrate 46.

In an embodiment, the source 52 is electrically coupled to a voltage source 62, which is labeled as an Input/Output (I/o) in FIG. 3. In an embodiment, the voltage source 62 provides a voltage of greater than about three volts (e.g., 3.3V). In an embodiment, the drain 54 and the gate oxide 56 are each coupled to a ground 64, which is labeled as Vss is FIG. 3. Due to these electrical connections, a channel 66 may be formed in and through the fin 50 between the source 52 and the drain 54.

Still referring to FIG. 3, the gate oxide 56 is generally formed over the fin 50. In an embodiment, the gate oxide 56 engages or abuts the fin 50. As shown in FIG. 3, the gate oxide 56 is laterally spaced apart from the source 52 by a back off region 68 of the fin 50. As such, the gate oxide 56 generally covers a first portion of the fin top surface 70 and leaves a second portion of the fin top surface 70, which corresponds to the back off region 68, uncovered by the gate oxide 56. In other words, only part of the fin top surface 70 of the fin 50 is covered by the gate oxide 56.

In an embodiment, the gate oxide 56 covers the portion of the fin 50 immediately adjacent to the drain 54. Indeed, in an embodiment an outer sidewall of the gate oxide 56 is generally vertically aligned with an inner sidewall of the drain 54. In an embodiment, the back off region 68 is immediately adjacent to the source 52. In an embodiment, the width of the back off region 68 is less than the width of the gate oxide 56.

Referring now to FIG. 4, a top plan view of the gated diode 10 of FIG. 1 is provided. As shown in FIG. 4, the width of the gate oxide 22 disposed between the source 18 and the drain 20 is approximately 136 nanometers (nm). Referring now to FIG. 5, a top plan view of the STI diode 28 of FIG. 2 is provided. As shown in FIG. 5, the width of an Epi block between the source 36 and the drain 38 is approximately 144 (nm), the lateral space between neighboring fins is approximately 66 nm, and a length of the fins projecting into the Epi block is approximately 39 nm.

Referring now to FIG. 6, a top plan view of the embodiment diode 44 of FIG. 3 is provided. As shown in FIG. 6, the width of the Epi block is approximately 144 nm while the width of the gate oxide 56 is approximately 36 nm. As such, the width of the uncovered portion of the fin in the embodiment diode 44 is 108 nm. Depending on desired device parameters, other dimensions may be used for the embodiment diode 44 and those shown in FIG. 6 are not meant to be limiting.

Figure 7:
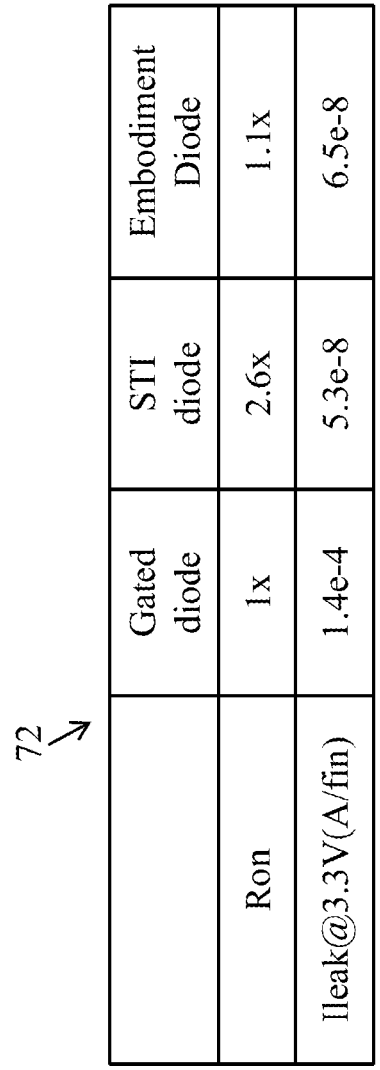
FIG. 7 is a chart comparing the on resistance ($R_{on}$) and reverse leakage current of the gated diode of FIG. 1, the STI diode of FIG. 2, and the embodiment diode of FIG. 3.

Referring now to FIG. 7, a chart 72 comparing the on resistance ($R_{on}$) and reverse leakage current of the gated diode 10, the STI diode 28, and the embodiment diode 44. As shown by the chart 72, the embodiment diode 44 has an on resistance similar to the on resistance of the gated diode 10 and far less than the on resistance of the STI diode 28. In addition, the embodiment diode 44 has a reverse leakage current similar to the leakage current of STI diode 28 and far less than the reverse leakage current of the gated diode 10. Notably, the reverse leakage current in the chart 72 of FIG. 7 is measured while providing approximately 3.3V.

Figures 8, 9:
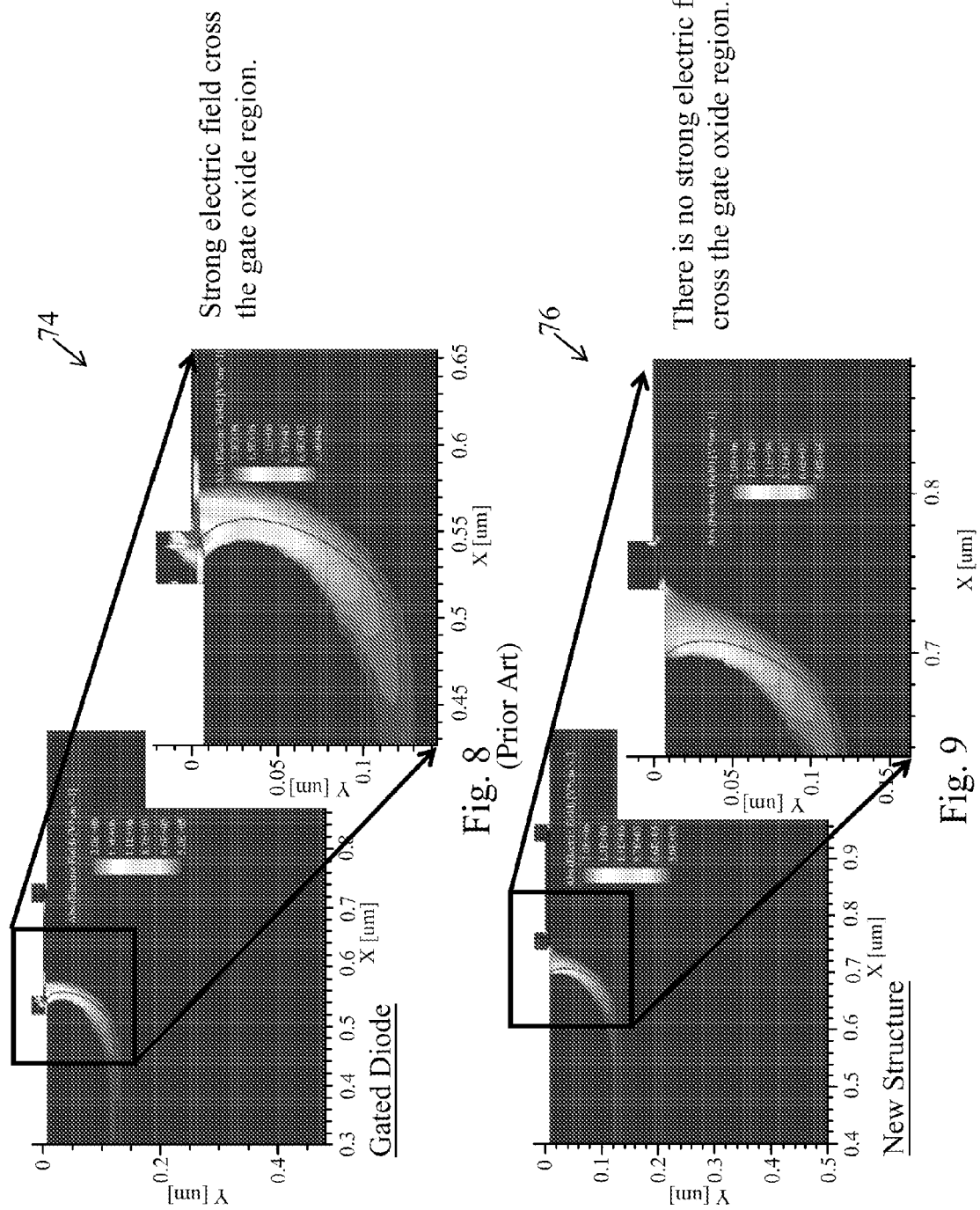
FIG. 8 is a graphical illustration of an electrical field across the region of the gate oxide in the gated diode of FIG. 2 is provided.
FIG. 9 is a graphical illustration of an electrical field across the region of the gate oxide in the embodiment diode of FIG. 3 is provided.

Referring now to FIG. 8, a graphical illustration 74 of an electrical field across the region of the gate oxide 56 in the gated diode 10 of FIG. 2 is provided. As shown, the electrical field is relatively strong. Referring now to FIG. 9, a graphical illustration 76 of an electrical field across the region of the gate oxide 56 in the embodiment diode 44 of FIG. 3 is provided. As shown, the strong electrical field in FIG. 8 is no longer present.

Referring now to FIG. 10, a method 80 of forming the embodiment diode 44 of FIG. 3 is illustrated. In block 82, a well having a first doping type is formed over a substrate having the first doping type. The well includes the fin 50 having the fin top surface 70. In block 84, the source 52 and the drain 54 are formed on opposing sides of the fin 50. The source 52 has a second doping type and the drain 54 has the first doping type. In block 86, the first portion of the fin top surface 70 is covered with the gate oxide 56, which leaves a second portion of the fin top surface 70 corresponding to the back off region 68 uncovered by the gate oxide 56.

From the foregoing, it should be recognized that the embodiment diode 44 provides numerous advantages relative to conventional diodes such as the gated diode 10 of FIG. 1 and the STI diode 28 of FIG. 2. For example, the embodiment diode 44 does not suffer from the overstress issue when a relatively high voltage (e.g., 3.3V) is supplied. In addition, the embodiment diode 44 has a lower reverse leakage current compared to the gated diode 10. The embodiment diode 44 also has an on resistance ($R_{on}$) that is approximately one third of the on resistance of the STI diode 28. Moreover, no additional mask or process is needed when forming the embodiment diode 44.

An embodiment integrated circuit includes a well having a first doping type formed over a substrate having the first doping type, the well including a fin, a source formed over the well on a first side of the fin, the source having a second doping type, a drain formed over the well on a second side of the fin, the drain having the first doping type, and a gate oxide formed over the fin, the gate oxide laterally spaced apart from the source by a back off region of the fin.

An embodiment a well having a first doping type formed over a substrate having the first doping type, the well including a fin having a fin top surface, a source and a drain formed on opposing sides of the fin, the source having a second doping type and the drain having the first doping type, and a gate oxide covering a first portion of the fin top surface and leaving a second portion of the fin top surface corresponding to a back off region uncovered by the gate oxide.

An embodiment method of forming an integrated circuit includes forming a well having a first doping type over a substrate having the first doping type, the well including a fin having a fin top surface, forming a source and a drain on opposing sides of the fin, the source having a second doping type and the drain having the first doping type, and covering a first portion of the fin top surface with a gate oxide and leaving a second portion of the fin top surface corresponding to a back off region uncovered by the gate oxide.

In an embodiment, an integrated circuit is provided. The integrated circuit includes a first source/drain region having a first conductivity type, a second source/drain region having a second conductivity type, the first conductivity type being different than the second conductivity type, and a channel region interposed between the first source/drain region and the second source/drain region, the channel region having the second conductivity type. The second source/drain region has a higher dopant concentration of the second conductivity type than the channel region. The integrated circuit further includes a gate dielectric over the channel region, the gate dielectric having a first edge closest to the first source/drain region and a second edge closest to the second source/drain region, wherein the first edge is laterally offset from the first source/drain region in a plan view; and a gate electrode over the gate dielectric, and wherein the gate electrode and the second source/drain region are connected to a first node.

In yet another embodiment, a method of forming an integrated circuit is provided. The method includes forming a fin, forming first source/drain region in the fin, the first source/drain region having a first conductivity type and forming a second source/drain region in the fin, the second source/drain region being spaced apart from the first source/drain region by a channel region, the second source/drain region and the channel region having a second conductivity type. A gate dielectric is formed over the channel region, the gate dielectric being spaced apart from an interface between the first source/drain region and the channel region in a plan view. The method further includes forming a gate electrode over the gate dielectric and electrically coupling the gate electrode and the second source/drain region.

In yet still another embodiment, a method of forming an integrated circuit is provided. The method includes forming a first source/drain region having a first conductivity type and forming a second source/drain region spaced apart from the first source/drain region by a channel region, the second source/drain region and the channel region having a second conductivity type, the first source/drain region and the channel region having a first interface, the second source/drain region and the channel region having a second interface. A gate dielectric is formed over the channel region, the gate dielectric being spaced apart from the first interface by a back off region in a plan view. The method further includes forming a gate electrode over the gate dielectric and electrically coupling the gate electrode and the second source/drain region.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. An integrated circuit comprising:
    a first source/drain region having a first conductivity type;
    a second source/drain region having a second conductivity type, the first conductivity type being different than the second conductivity type;
    a channel region interposed between the first source/drain region and the second source/drain region, the channel region having the second conductivity type, the second source/drain region having a higher dopant concentration of the second conductivity type than the channel region;
    a gate dielectric over the channel region, the gate dielectric having a first edge closest to the first source/drain region and a second edge closest to the second source/drain region, wherein the first edge is laterally offset from an interface between the channel region and the first source/drain region in a plan view; and
    a gate electrode over the gate dielectric, wherein the gate electrode and the second source/drain region are connected to a first node.

2. The integrated circuit of claim 1, wherein the first source/drain region is electrically coupled to a voltage source of greater than about three volts.

3. The integrated circuit of claim 1, wherein the first node is electrically coupled to a ground.

4. The integrated circuit of claim 1, wherein the first conductivity type is n-type and the second conductivity type is p-type.

5. The integrated circuit of claim 1, wherein a first distance from the first source/drain region to the gate dielectric is greater than a width of the gate dielectric.

6. The integrated circuit of claim 1, wherein a sidewall of the gate dielectric is vertically aligned with a sidewall of the second source/drain region.

7. The integrated circuit of claim 1, wherein a top surface of the channel region is planar.

8. A method of forming an integrated circuit, the method comprising:
    forming a fin;
    forming first source/drain region in the fin, the first source/drain region having a first conductivity type;
    forming a second source/drain region in the fin, the second source/drain region being spaced apart from the first source/drain region by a channel region, the second source/drain region and the channel region having a second conductivity type, the first conductivity type being an opposite conductivity type of the second conductivity type;
    forming a gate dielectric over the channel region, the gate dielectric being spaced apart from an interface between the first source/drain region and the channel region in a plan view;
    forming a gate electrode over the gate dielectric; and
    electrically coupling the gate electrode and the second source/drain region.

9. The method of claim 8, further comprising electrically coupling the gate electrode and the second source/drain region to ground.

10. The method of claim 8, further comprising electrically coupling the first source/drain region to a voltage source greater than about three volts.

11. The method of claim 8, wherein the first conductivity type is n-type and the second conductivity type is p-type.

12. The method of claim 8, wherein a first distance from the first source/drain region to the gate dielectric is greater than a width of the gate dielectric.

13. The method of claim 8, wherein a top surface of the channel region is planar.

14. A method of forming an integrated circuit, the method comprising:
    forming a first source/drain region, the first source/drain region having a first conductivity type;
    forming a second source/drain region spaced apart from the first source/drain region by a channel region, the second source/drain region and the channel region having a second conductivity type, the first conductivity type being different from the second conductivity type the first source/drain region and the channel region having a first interface, the second source/drain region and the channel region having a second interface;
    forming a gate dielectric over the channel region, the gate dielectric being spaced apart from the first interface by a back off region in a plan view;
    forming a gate electrode over the gate dielectric; and
    electrically coupling the gate electrode and the second source/drain region.

15. The method of claim 14, further comprising electrically coupling the gate electrode and the second source/drain region to ground.

16. The method of claim 14, further comprising electrically coupling the first source/drain region to a voltage source greater than about three volts.

17. The method of claim 14, wherein the first conductivity type is n-type and the second conductivity type is p-type.

18. The method of claim 14, wherein a width of the back off region is greater than a width of the gate dielectric.

19. The method of claim 14, wherein a top surface of the channel region is planar.

20. The method of claim 14, wherein an edge of the gate dielectric is aligned with the second interface.

* * * * *